(12) United States Patent
Kochetkov et al.

(10) Patent No.: US 10,250,190 B2
(45) Date of Patent: Apr. 2, 2019

(54) MULTI-LEVEL DIGITAL ADAPTIVE PA BIAS FOR MICROWAVE RADIOS

(71) Applicant: ZTE Corporation, Shenzhen (CN)

(72) Inventors: Andrey Kochetkov, Cary, NC (US); Ying Shen, Chapel Hill, NC (US); Shawn Walsh, Cary, NC (US); Thanh Nguyen, Cary, NC (US); Aleksandr Semenyshev, Apex, NC (US); Zhiping Feng, Chapel Hill, NC (US)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/588,452

(22) Filed: May 5, 2017

(65) Prior Publication Data

US 2018/0323747 A1    Nov. 8, 2018

(51) Int. Cl.
| | |
|---|---|
| *H03F 1/02* | (2006.01) |
| *H03F 3/19* | (2006.01) |
| *H03F 3/21* | (2006.01) |
| *H03G 3/30* | (2006.01) |
| *H03F 3/195* | (2006.01) |
| *H03F 3/24* | (2006.01) |

(52) U.S. Cl.
CPC ............ *H03F 1/0205* (2013.01); *H03F 3/195* (2013.01); *H03F 3/245* (2013.01); *H03F 2200/102* (2013.01); *H03F 2200/252* (2013.01); *H03F 2200/451* (2013.01)

(58) Field of Classification Search
USPC ................ 330/297, 279, 127, 129, 134, 136
See application file for complete search history.

(56) References Cited

U.S. PATENT DOCUMENTS

| 6,788,151 B2 * | 9/2004 | Shvarts | H03F 1/025 330/127 |
|---|---|---|---|
| 9,385,662 B2 * | 7/2016 | Wimpenny | H03F 1/0227 |
| 9,800,274 B2 * | 10/2017 | Yan | H04B 1/0475 |

* cited by examiner

*Primary Examiner* — Hieu P Nguyen
(74) *Attorney, Agent, or Firm* — Duane Morris LLP

(57) ABSTRACT

A method for biasing a power amplifier using a transmission signal having a time-varying envelope is provided. The method comprises producing a time-varying signal indicative of an amplitude of the envelope of the transmission signal and comparing the time-varying signal to a plurality of distinct threshold voltages. The method further comprises, for each of the plurality of distinct threshold voltages exceeded by the time-varying signal, providing a respective bias voltage to a respective input of a summing device and producing, using the summing device, an output bias voltage that is at least a sum of the respective bias voltages provided to the respective inputs of the summing device. The method further comprises biasing the power amplifier with the output bias voltage and amplifying the transmission signal using the power amplifier biased at the output bias voltage.

17 Claims, 3 Drawing Sheets

MULTI-LEVEL DIGITAL ADAPTIVE PA BIAS FOR MICROWAVE RADIOS

TECHNICAL FIELD

This application relates generally to backhaul wireless telecommunication and particularly to a multi-level adaptive bias system for radio frequency power amplifiers (PAs).

BACKGROUND

Conventional adaptive bias techniques are used to improve the power efficiency of radio frequency (RF) power amplifiers. Traditionally, the bias voltage of a Class A amplifier is fixed and optimized for a maximum signal level. The amplifier only operates at this signal power level for a small fraction of time. Thus, the amplifier does not consistently operate at its optimized power efficiency.

SUMMARY

An object of the present application is to provide a dynamically changing bias voltage to follow the RF signal envelope, in order to adapt the bias to keep the bias voltage at a level necessary for the RF signal amplitude while optimizing power efficiency. In some circumstances, a switch circuit can be used to adapt a PA bias voltage. However, this method relies on switching between two bias voltages based on a single threshold voltage to which the signal's envelope is compared. The present application provides a digital circuit that adapts the PA bias voltage using additional threshold voltages. The multi-levels digital adaptive bias circuit allows more flexibility (e.g., in setting different threshold levels), is cheap to manufacture (e.g., easy to produce), and can optimize (e.g., by continuously updating) the threshold voltages and corresponding bias voltages (e.g., for each threshold) based on the envelope of the RF signal.

A power amplifier circuit used to adapt the bias voltage is provided. The circuit comprises a power amplifier, for amplifying a transmission signal, where the transmission signal has a time-varying envelope and an envelope detector that produces a time-varying signal indicative of an amplitude of the envelope of the transmission signal. The circuit further comprises a plurality of comparators for comparing the time-varying signal to a plurality of distinct threshold voltages, where each comparator has a first input that receives the time-varying signal and a second input that receives a respective threshold voltage of the plurality of distinct threshold voltages. The circuit further comprises a plurality of switches, with each switch having a first terminal and a second terminal, and where each switch is controlled by an output of a respective comparator of the plurality of comparators to form a conductive channel between the first terminal and the second terminal when the time-varying signal indicative of the amplitude of the envelope of the transmission signal exceeds the respective threshold voltage for the respective comparator. The circuit further comprises a plurality of digital-to-analog converters (DACs) providing a plurality of bias voltages, wherein the first terminal of each switch of the plurality of switches is coupled to a respective DAC of the plurality of DACs and a summing device having inputs coupled to the second terminals of each of the plurality of switches to produce an output bias voltage that is at least a sum of bias voltages from each of the second terminals of the plurality of switches, wherein the output bias voltage is applied to bias the power amplifier.

In some embodiments, the power amplifier amplifies the signal carrying information prior to transmission of the signal by an antenna.

In some embodiments, the circuit further comprises a processor (e.g., a CPU) and memory, wherein the memory stores values for the plurality of distinct threshold voltages. In some embodiments, the memory further stores values for the plurality of distinct bias voltages corresponding to the plurality of distinct threshold voltages.

In some embodiments, wherein the processor reprograms the plurality of distinct threshold voltages (e.g., by reprogramming the digital-to-analog converters) based on a predefined change the transmission signal.

In some embodiments, the power amplifier circuit is part of an integrated circuit.

In some embodiments, the switches are field effect transistors (FETs).

In some embodiments, the summing device is also coupled to a minimum bias voltage.

In some embodiments, an operational amplifier amplifies the output from the summing device before applying the bias voltage to the power amplifier.

In some embodiments, the circuit further includes an up-converter, wherein the envelope detector is connected to an input port of the up-converter. In some embodiments, an input port of the power amplifier is connected to an output port of the up-converter.

BRIEF DESCRIPTION OF DRAWINGS

The accompanying drawings, which are included to provide a further understanding of the embodiments and are incorporated herein and constitute a part of the specification, illustrate the described embodiments and together with the description serve to explain the underlying principles. Like reference numerals refer to corresponding parts.

DETAIL DESCRIPTIONS

Reference will now be made in detail to embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. With reference now to the figures, an exemplary circuit and signal responses are provided in which illustrative embodiments may be implemented. It should be appreciated that these figures are only exemplary and are not intended to assert or imply any limitation with regard to the environments in which different embodiments may be implemented. Many modifications to the depicted embodiments may be made.

The present disclosure provides a circuit for adaptively biasing a power amplifier in a microwave radio transmission system. In particular, the circuit biases the power amplifier based on the envelope of the transmitted signal. The circuit compares the amplitude of the envelope to a set of threshold voltages. For each threshold voltage exceeded by the amplitude of the envelope, the circuit provides an additional marginal bias voltage to a summing device. The sum of the marginal bias voltages is a bias voltage that is used to bias the power amplifier. As the amplitude of the envelope changes, the bias voltage on the power amplifier thus also changes. The use of marginal bias voltages simplifies the design of the biasing circuit. In addition, the threshold voltages and bias voltages are, in some embodiments, stored in a look-up table and are re-programmable based on, for example, the modulation type used for the transmission signal.

As used herein, the term envelope refers to a smooth curve outlining magnitude of the extrema of a transmitted signal, where the transmitted signal is carried at a much higher frequency (e.g., intermediate frequency or radio frequency).

Figure 1:
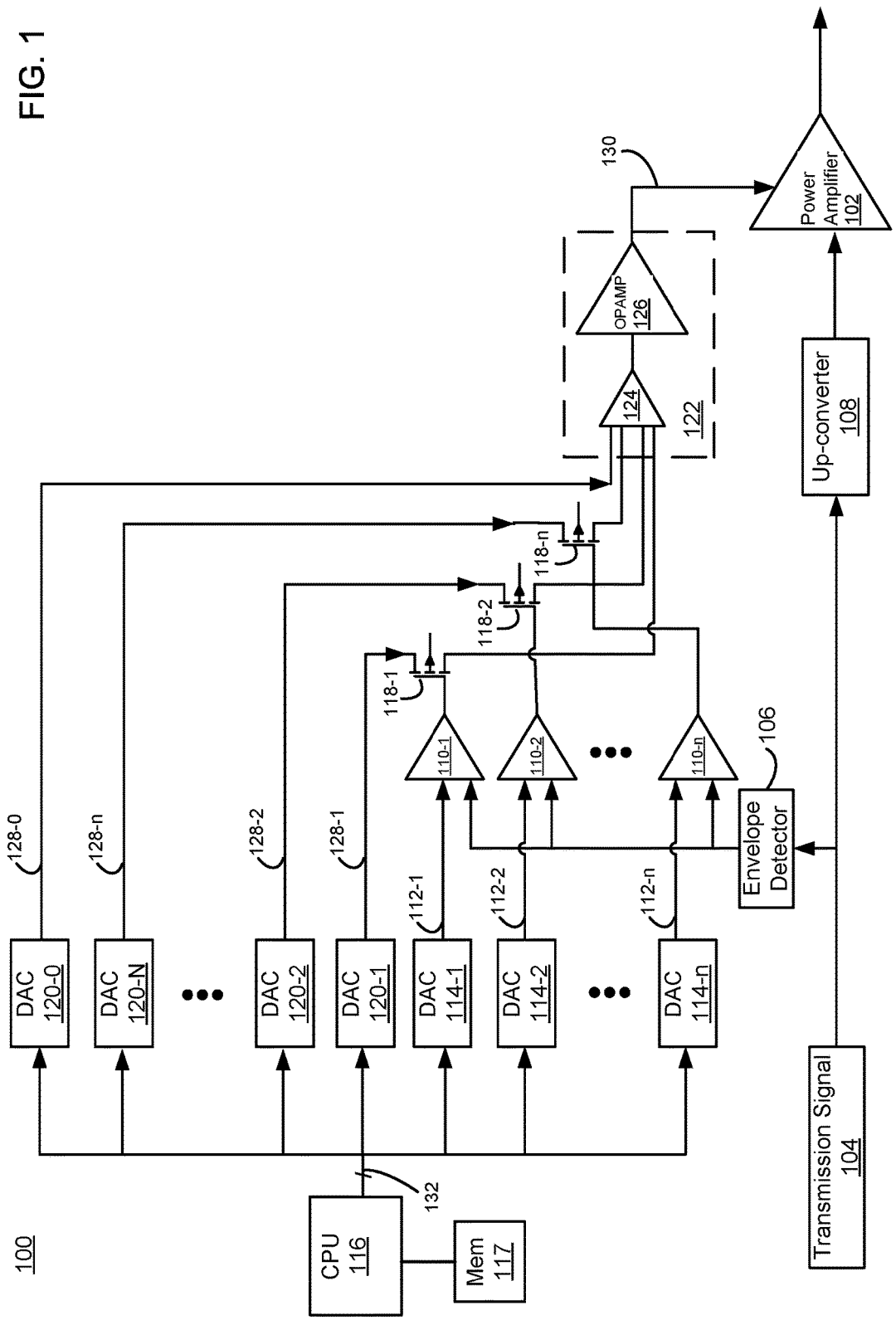
FIG. 1 is a block diagram illustrating a power amplifier circuit, in accordance with some embodiments.

FIG. 1 depicts a block diagram of a power amplifier circuit 100, in accordance with some embodiments. The power amplifier circuit 100 comprises power amplifier 102 for amplifying transmission signal 104 (e.g., a modulated intermediate frequency (IF) signal from a modem). In some embodiments, transmission signal 104 has a time-varying envelope (e.g., $V_{env}$). The circuit 100 further comprises envelope detector 106 that produces a time-varying signal indicative of an amplitude of the envelope of the transmission signal. In some embodiments, envelope detector 106 is connected to a port of up-converter 108. In some embodiments, up-converter 108 is used to convert an intermediate frequency (IF) signal into a radio frequency (RF) signal (e.g., converts the transmission signal 104 from a lower frequency to a higher frequency).

In some embodiments, the circuit 100 further includes up-converter 108. In various circumstances, the envelope detector can detect the envelope of an intermediate frequency (IF) signal or a radio frequency (RF) signal that results from up-converting (e.g., with up-converter 108) the IF signal. Thus, in various embodiments, the envelope detector 106 (e.g., the envelope of transmission signal 104) is connected to an input port of up-converter 108 or an input port of power amplifier 102 (e.g., transmission signal 104). In some embodiments (e.g., when the envelope is detected from the IF signal), an input port of the power amplifier 102 is connected to an output port of the up-converter 108. For example, the transmission signal (e.g., modulated IF signal) is provided to both up-converter 108 as well as envelope detector 106.

In some embodiments, the circuit 100 further comprises a plurality of comparators 110 (e.g., comparators 110-1 to 110-n, where n is an integer greater than or equal to 2) for comparing the time-varying signal (e.g., the output of envelope detector 106 based on detection of the envelope of transmission signal 104) to a plurality of distinct threshold voltages (e.g., voltages carried on wires 112-1 to 112-n). In some embodiments, the plurality of distinct threshold voltages are provided by a plurality of digital-to-analog converters (DACs) 114. For example, DAC 114-1 controls a threshold voltage carried on wire 112-1 and DAC 114-n controls a threshold voltage carried on wire 112-n (e.g., DACs 114 output voltages carried on wires 112). Thus, DACs 114 are a first set DACs comprising a plurality of DACs that sets the threshold voltages.

In some embodiments, each comparator 110 (e.g., of the plurality of comparators 110-1 to 110-n) has a first input that receives the time-varying signal (e.g., transmission signal 104 after passing through envelope detector 106) and a second input that receives a respective threshold voltage (e.g., $V_{t,i}$, voltage carried on wire 112-i, where i is an integer between 1 and n) of the plurality of distinct threshold voltages (e.g., voltages carried on wires 112-1 to 112-n). For example, the time-varying signal from an output of envelope detector 106 is provided (e.g., by a single wire) to the first input of each comparator of the plurality of comparators (e.g., the first input of each comparator receives the time-varying signal representative of the amplitude of the envelope of the transmission signal).

The circuit further comprises a plurality of switches 118 (e.g., switches 118-1 to 118-n), with each switch 118 having a first terminal and a second terminal, and where each switch 118 is controlled by an output of a respective comparator 110 of the plurality of comparators to form a conductive channel between the first terminal and the second terminal when the time-varying signal indicative of the amplitude of the envelope of the transmission signal exceeds the respective threshold for the respective comparator 110. In some embodiments, each comparator compares a respective threshold voltage (e.g., signal of voltage carried on a respective wire 112) to the received time-varying signal to control the switches (e.g., turn the switches "on" or "off"). When the time-varying signal is less than the respective voltage, that switch is open (e.g., "off"). For example, the switch turns "on" when $V_{t,i} < V_{env}$ (where $V_{t,i}$ is the threshold voltage received by the $i^{th}$ comparator, since each comparator generally is set to a different threshold voltage using a different DAC 114).

The circuit further comprises a plurality of DACs 120 providing a plurality of bias voltages 128 (e.g., voltages carried on wires 128-0 to 120-n produced by DACs 120-0 to 120-n), wherein the first terminal of each switch of the plurality of switches is coupled to a respective DAC 120 (e.g., voltage output of DAC 120) of the plurality of DACs 120. In some embodiments, the plurality of bias voltages 128 are distinct bias voltage (e.g., the voltages are different from one another). Thus, DACs 120 is a second set of DACs comprising a plurality of DACs that sets the bias voltages.

In some embodiments, a central processing unit (CPU) 116 controls the plurality of DACs 114 (e.g., threshold setting DACs) and the plurality of DACs 120 (e.g., bias voltage setting DACs). In some embodiments, CPU 116 is operatively coupled to DACs 114 and 120 through bus 132. In some embodiments, CPU 116 programs DACs 114 and DACs 120 using a control signal (e.g., serially programming the DACs). In some embodiments, CPU 116 programs DACs 114 and DACs 120 in parallel (e.g., sends a first signal to DAC 114-1 and sends an nth signal to DAC 114-n). In some embodiments, CPU 116 programs DACs 114 to output different threshold voltages.

The circuit 100 further comprises summing device 122 (e.g., comprising sum block 124 and operational amplifier 126) having inputs coupled to the second terminals of each of the plurality of switches to produce an output bias voltage that is at least a sum of bias voltages from each of the second terminals of switches 118, wherein the output bias voltage 130 is applied to bias power amplifier 102.

For example, if the time-varying signal is less than each of the distinct thresholds, all switches 118 are "open" (e.g., "off" such that no bias voltages on wires 128-1 to 128-n flow through the switches) and the input to summing device 122 is a minimum bias voltage (e.g., voltage carried on wire 128-0). In some embodiments, the minimum bias voltage is supplied to the summing device (e.g., to bias the power amplifier) without a switch (e.g., directly).

For example, where the time-varying signal is higher (e.g., greater than in magnitude or amplitude) than threshold voltage carried on wire 112-1 (e.g., first threshold voltage, as determined by comparator 110-1), switch 118-1 is "closed" (e.g., "on," such that bias voltage carried on wire 128-1 flows through the switch) and bias voltage 128-1 (e.g., first bias voltage) is added (e.g., using sum block 124) to minimum bias voltage carried on wire 128-0. In some circumstances (e.g., when the time-varying signal exceeds none of the threshold voltages), all of switches 118 are open. In some circumstances (e.g., when the time-varying signal exceeds all of the threshold voltages), all of switches 118 are closed (e.g., all bias voltages 128 are summed by bias the power amplifier). In some embodiments, one or more switches are open while the remaining switches are closed (e.g., when the time-varying signal is greater the lowest threshold voltage and less than the highest threshold voltage).

In some embodiments, when the time-varying signal increases, it sequentially crosses (e.g., exceeds) the values of the various threshold voltages (e.g., starting with first threshold voltage 112-1) such that switches 118 sequentially change from "open" to "closed" (e.g., where threshold voltages increase in value starting from first threshold voltage 112-1 and increasing through 112-n), and the bias applied to power amplifier 102 increases (e.g., marginally, based on a corresponding marginal bias voltage, as each switch closes). For example, where switches 118-1 and 118-2 have closed (e.g., sequentially in response to the time-varying signal exceeding threshold voltages 112-1 and 112-2) the bias applied to power amplifier 102 is at least the sum of bias voltages carried on wires 128-0+128-1+128-2. When switches 118-1 through 118-n are all closed, the bias applied to power amplifier 102 is at least the sum of bias voltages carried on all of the wires 1280 (e.g., the voltage on wire 128-0+128-1+128-2 . . . +128-n). In some embodiments, when the time-varying signal (e.g., amplitude of the envelope) decreases, the switches change from "closed" to "open" (e.g., starting with switch 118-n).

In some embodiments, power amplifier 102 amplifies the signal carrying information (e.g., the signal output from the power amplifier) prior to transmission of the signal by an antenna.

In some embodiments, the circuit 100 further comprises a processor (e.g., CPU 116) and memory 117, wherein the memory stores values for the plurality of distinct threshold voltages (e.g., to set the values of threshold voltages produced by DACs 114). In some embodiments, the memory 117 further stores values for the plurality of distinct bias voltages corresponding to the plurality of distinct threshold voltages (e.g., each threshold voltage has a corresponding bias level). In some embodiments, each DAC 114 is programmed using a respective value of a threshold voltage stored in the memory. The DAC 114 output produces a corresponding threshold voltage. The output is coupled to a corresponding first input of a comparator of the plurality of comparators. In some embodiments, each DAC 120 is programmed using a respective bias voltage value stored in the memory. The DAC 120 output produces a corresponding bias voltage (e.g., marginal bias voltage). The output is coupled to a corresponding first input of a switch of the plurality of switches, so that the bias voltage is passed to the summing device 120 when the switch is closed due to the comparison of the time-varying signal representative of the transmission signal's envelope amplitude to a corresponding threshold voltage.

In some embodiments, CPU 116 reprograms the plurality of distinct threshold voltages (e.g., by reprogramming DACs 114) and/or reprograms the plurality of bias voltages (e.g., by reprogramming DACs 120) using thresholds voltages and bias voltages for DACs 114 and DACs 120, respectively, based on (e.g., in response to) a predefined change in the transmission signal (e.g., a change in modulation or a change in radio output power level). In some embodiments, bus 132 is a connection through which CPU 116 is in communication with the DAC 114/120s to reprogram the DACs based on a digital signal.

For example, in some embodiments, the values for the plurality of distinct threshold voltages (e.g., produced by DAC 114-1 to DAC 114-n) are selected from a look-up table (e.g., stored in CPU 116) based on the time-varying signal. In some embodiments, the look-up table stores more than one set of values for the plurality of distinct threshold voltages based on a modulation-type of the transmission signal (e.g., QAM1024, QPSK, QAM4096). For example, when the modulation type is QAM1024, the power amplifier circuit 100 uses a first set of values for threshold voltages, and when the modulation type is QPSK, the power amplifier circuit 100 uses a second set of values for threshold voltages (e.g., the values are different than the first set of values for threshold voltages). Both the first set of values for threshold voltages and the second set of values for threshold voltages are stored in the look-up table (e.g., memory). In some embodiments, the same set of values for threshold voltages can be used for a plurality of modulation types (e.g., fixed threshold voltage values can be used for all modulation indexes).

As another example, in some embodiments, the values for the plurality of bias voltages are also stored in the memory (e.g., within the same look-up table or a different look-up table). In some embodiments, the memory 117 stores more than one set of values for bias voltages. For example, when the modulation type is QAM1024, the power amplifier circuit 100 uses a first set of bias voltages, and when the modulation type is QPSK, the power amplifier circuit 100 uses a second set of values for bias voltages (e.g., that is different than the first set of bias voltages). Both the first set of values for bias voltages and the second set of values for bias voltages are stored in the memory (e.g., in the look-up table). In some embodiments, the values for the plurality of the threshold voltages are dependent on the modulation index, average power amplifier output level, and the environmental condition of the power amplifier (e.g., temperature). In some embodiments, the values for the plurality of the threshold voltages are determined during the design or manufacturing calibration and are stored in memory 117 (which is optionally a component of CPU 116). For example, when the CPU 117 changes radio output level (e.g., where the output levels are set by the CPU), the CPU also reprograms the DACs 114 with a new set of values for the plurality of threshold voltages and a new set of values for the plurality of bias voltages.

In some embodiments, the power amplifier circuit 100 is part of an integrated circuit (e.g., monolithically integrated circuit or microchip).

In some embodiments, switches 118 are field effect transistors (FETs).

In some embodiments, the plurality of bias voltages from each of the second terminals of the plurality of switches are marginal voltages (e.g., added to all the previous voltages rather than absolute bias voltage values).

In some embodiments, summing device 122 is also coupled to a minimum bias voltage (e.g., voltage carried on wire 128-0 produced by DAC 120-0). In some embodiments, the value of the minimum bias voltage has the same value as the bias voltage that is applied to the power amplifier when the time-varying signal indicative of the amplitude of the envelope of the transmission signal exceeds none of the respective threshold voltages. For example, when all switches 118 are turned "off" (e.g., the amplitude of the time-varying signal is lower than the lowest threshold voltage, $V_{t1} > V_{env}$), the minimum bias voltage is the only voltage that is applied to bias the power amplifier.

Figure 2:
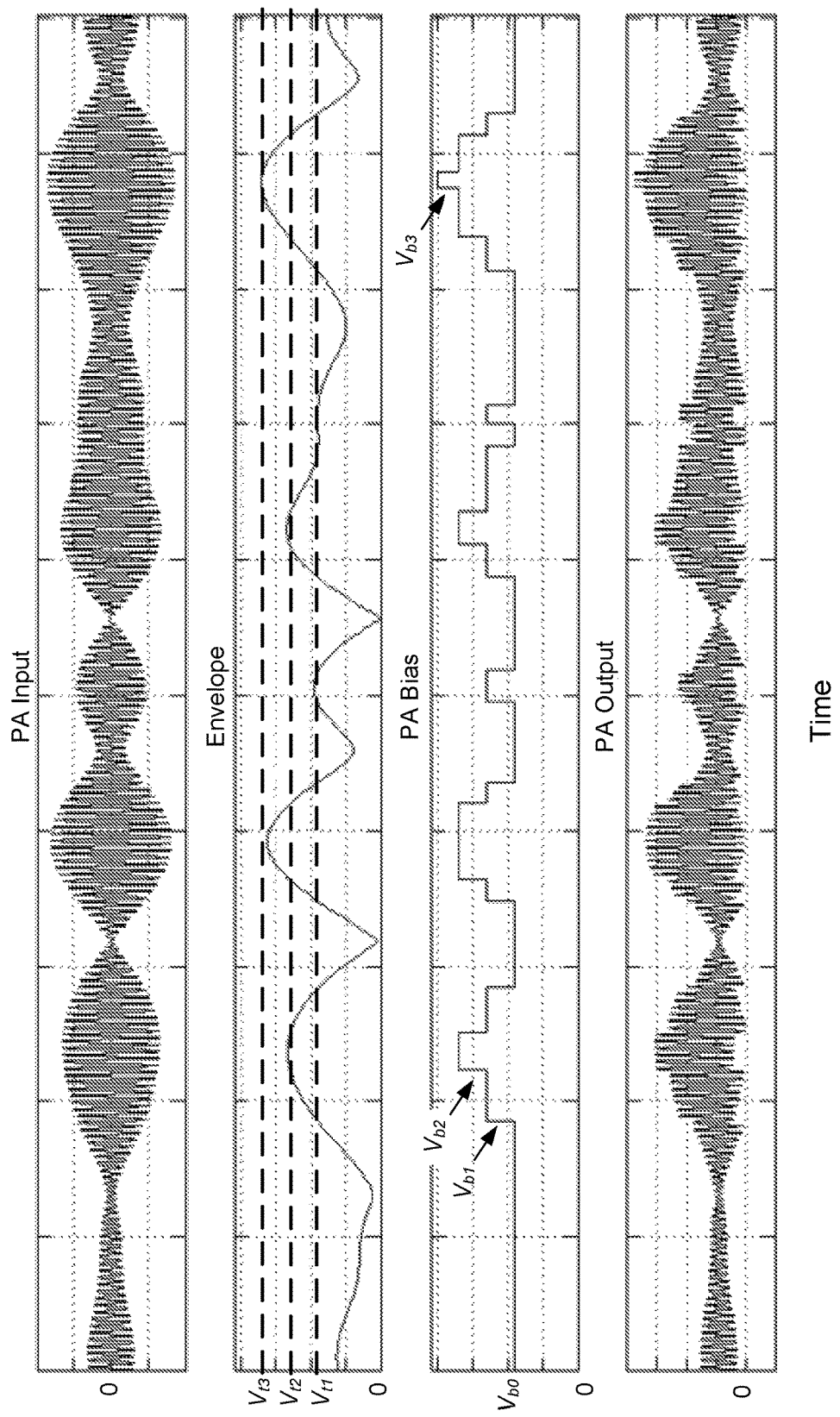
FIG. 2 is a graph illustrating various signal responses of the circuit over time, in accordance with some embodiments.

FIG. 2 illustrates four graphs showing a various simulated responses for the power amplifier circuit 100 using a plurality of threshold voltages (e.g., N threshold voltages, where N is an integer). The four graphs show the power amplifier input signal (e.g., transmission signal 104 passed through up-converter 108), envelope detected (e.g., the signal at the output of envelope detector 106), power amplifier bias signal (e.g., voltage carried on wire 130), and power amplifier output signal (e.g., output from power amplifier 102) over time (e.g., in milliseconds). In some embodiments, the value of the threshold voltages correspond to threshold voltages carried on wires 112.

The signals as shown in the graph are based on a simulation using N=3 threshold voltages and a minimum bias voltage. Whenever the envelope is below first threshold voltage $V_{t1}$, the bias voltage is the minimum bias voltage $V_{b0}$. Whenever the envelope exceeds $V_{t1}$, first bias voltage $V_{b1}$ is added to $V_{b0}$, so that the bias voltage is $V_{b0}+V_{b1}$. Whenever the envelope exceeds second threshold voltage $V_{t2}$, second bias voltage is added to $V_{b1}$ and $V_{b0}$, so that the bias voltage is $V_{b0}+V_{b1}+V_{b2}$. Finally, whenever the envelope exceeds third threshold voltage $V_{t3}$, third bias voltage $V_{b3}$ is added to $V_{b2}$, $V_{b1}$, and $V_{b0}$, so that the bias voltage is $V_{b0}+V_{b1}+V_{b2}+V_{b3}$.

In some embodiments, the power efficiency (e.g., of the multilevel digital bias system) increases with a greater number of threshold voltages (e.g., N threshold voltages). In some embodiments, where there are N threshold voltages, there are N+1 bias voltages (e.g., each threshold voltage has a corresponding bias voltage in addition to a minimum bias voltage).

Figure 3:
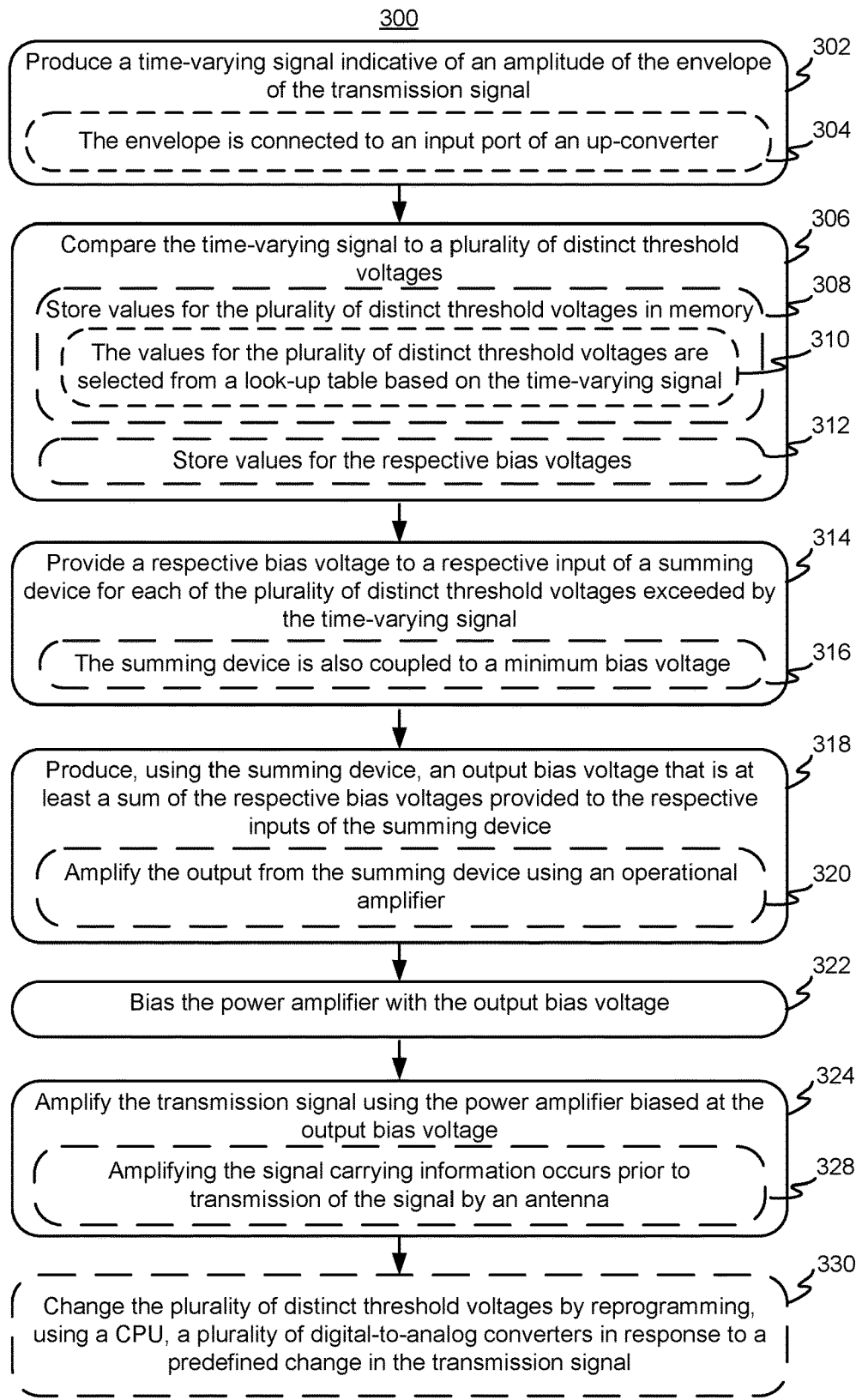
FIG. 3 is a flowchart illustrating a method of biasing a power amplifier, in accordance with some embodiments.

FIG. 3 depicts a flowchart of the method of the disclosed embodiments. In some embodiments, method 300 is performed by the power amplifier circuit as described with reference to FIG. 1. In some embodiments, method 300 is a method for biasing power amplifier 102 using transmission signal 104, wherein transmission signal 104 has a time-varying envelope. In some embodiments, the method comprises producing (302) (e.g., using envelope detector 106) a time-varying signal indicative of an amplitude of the envelope of transmission signal 104. In some embodiments, the envelope detected is connected (304) to an input port of up-converter 108. In some embodiments, the method is performed within an integrated circuit (e.g. a monolithically integrated circuit).

In some embodiments, the method further comprises comparing (306) (e.g., using comparators 110) the time-varying signal to a plurality of distinct threshold voltages (e.g., voltages carried by wires 112 produced by DACs 114). In some embodiments, the method further comprises storing (308) the plurality of distinct threshold voltages in memory. In some embodiments, the plurality of distinct threshold voltages are selected (310) from a look-up table based on the time-varying signal. In some embodiments, selecting the plurality of distinct threshold voltages form a look-up table based on the time-vary signal includes selecting (e.g., using CPU 116) the plurality of distinct threshold voltages based on a modulation type of the time-varying signal. For example, when the time-varying signal (e.g., modulated signal) changes from a QAM1024 modulated signal to a QPSK modulated signal, the plurality of distinct threshold voltages changes (e.g., by using the QPSK values stored in the look-up table instead of the QAM1024).

In some embodiments, selecting the plurality of distinct threshold voltages based on a modulation type of the time-varying signal includes automatically (e.g., by CPU 116) determining the modulation type without human intervention. In some embodiments, circuit 100 (FIG. 1) includes additional circuitry for detecting the modulation type, and CPU 116 automatically detects a change in the modulation type using the additional circuit. In accordance with the detected change in modulation type, CPU 116 selects an updated set of threshold voltages corresponding to the new modulation type.

In some embodiments, the plurality of voltage bias levels changes for different modulation types (or based on other properties of the signal) in an analogous manner. In some embodiments, a group of threshold voltages is set for different IF signal envelope levels, where each reference voltage represents a separate threshold in each group.

In some embodiments, the memory also stores (312) a plurality of distinct bias levels (e.g., to be output by switches 118) corresponding to the plurality of distinct threshold voltages. For example, CPU 116 can store values for distinct threshold voltages produced by DACs 114 and distinct values for bias voltages produced by DACs 120.

In some embodiments, the method further comprises, for each of the plurality of distinct threshold voltages (e.g., produced by DACs 114) exceeded by the time-varying signal (e.g., based on the comparing operation performed by comparators 110) providing (314) a respective bias voltage to a respective input of sum block 124 (e.g., summing device 122). In some embodiments, providing the respective bias voltage is based on the output of switches 118. In some embodiments, sum block 124 is also coupled (316) (e.g., directly connected) to a minimal bias voltage, V0 (e.g., produced by DAC 120-0).

In some embodiments, the method further comprises producing (318), using summing device 122, an output bias voltage that is at least a sum of the respective bias voltages provided to the respective inputs of sum block 124 (e.g., the respective bias voltages from switches 118 in addition to minimal bias voltage, produced from DAC 120-0). In some embodiments, the method further comprises amplifying (320) (e.g., using operational amplifier 126) the output from sum block 124 before applying bias voltage to the power amplifier.

In some embodiments, the method further comprises biasing (322) power amplifier 102 with the output bias voltage from summing device 122.

In some embodiments, the method further comprises amplifying (324) transmission signal 104 using power amplifier 102, biased at the output bias voltage. In some embodiments, the amplifying of the signal carrying information occurs (328) prior to transmission of the signal by an antenna.

In some embodiments, the method further comprises reprogramming (330), using CPU 116, a plurality of digital-to-analog converters (e.g., DACs 114 and DACs 120) in response to a change in radio output power level based on a predefined set of threshold voltages.

In some embodiments, the method 300 can be performed continuously. For example, updating the time-varying signal, comparing the plurality of distinct threshold voltages, updating the distinct threshold voltages, and producing the output bias voltage can be performed continuously.

In some embodiments, the plurality of bias voltages from each of the second terminals of the plurality of switches are marginal voltages added to all the previous voltages rather than absolute bias values.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

The terminology used in the description of the embodiments herein is for the purpose of describing particular embodiments only and is not intended to limit the scope of claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc. may be used herein to describe various elements, these elements should not be limited by these terms. These terms are only used to distinguish one element from another. For example, a first port could be termed a second port, and, similarly, a second port could be termed a first port, without departing from the scope of the embodiments. The first port and the second port are both ports, but they are not the same port.

Many modifications and alternative embodiments of the embodiments described herein will come to mind to one skilled in the art having the benefit of the teachings presented in the foregoing descriptions and the associated drawings. Therefore, it is to be understood that the scope of claims are not to be limited to the specific examples of the embodiments disclosed and that modifications and other embodiments are intended to be included within the scope of the appended claims. Although specific terms are employed herein, they are used in a generic and descriptive sense only and not for purposes of limitation.

The embodiments were chosen and described in order to best explain the underlying principles and their practical applications, to thereby enable others skilled in the art to best utilize the underlying principles and various embodiments with various modifications as are suited to the particular use contemplated.

What is claimed is:

1. A power amplifier circuit, comprising:
   a power amplifier for amplifying a transmission signal, the transmission signal having a time-varying envelope;
   an envelope detector that produces a time-varying signal indicative of an amplitude of the envelope of the transmission signal;
   a plurality of comparators for comparing the time-varying signal to a plurality of distinct threshold voltages, each comparator having a first input receiving the time-varying signal and a second input receiving a respective threshold voltage of the plurality of distinct threshold voltages;
   a plurality of switches, each switch having a first terminal and a second terminal, each switch being controlled by an output of a respective comparator of the plurality of comparators to form a conductive channel between the first terminal and the second terminal when the time-varying signal indicative of the amplitude of the envelope of the transmission signal exceeds the respective threshold voltage for the respective comparator;
   a plurality of digital-to-analog converters (DACs) providing a plurality of bias voltages, wherein the first terminal of each switch of the plurality of switches is coupled to a respective DAC of the plurality of DACs;
   a summing device having inputs coupled to the second terminals of each of the plurality of switches to produce an output bias voltage that is at least a sum of bias voltages from each of the second terminals of the plurality of switches, wherein the output bias voltage is applied to bias the power amplifier;
   memory storing a plurality of sets of distinct threshold voltages, each set of the plurality of sets of distinct threshold voltages corresponding to a modulation type; and
   one or more processors configured to:
      detect a change in modulation type of the transmission signal; and
      reprogram the plurality of distinct threshold voltages to a different set of distinct threshold voltages, of the plurality of sets of distinct threshold voltages, based on the change in the modulation type of the transmission signal.

2. The power amplifier circuit of claim 1, wherein the power amplifier amplifies the signal carrying information prior to transmission of the signal by an antenna.

3. The power amplifier circuit of claim 1, the memory further storing values for the plurality of bias voltages corresponding to the plurality of distinct threshold voltages.

4. The power amplifier circuit of claim 1, wherein the power amplifier circuit is part of an integrated circuit.

5. The power amplifier circuit of claim 1, wherein the plurality of switches are FETs.

6. The power amplifier circuit of claim 1, wherein the summing device is also coupled to a minimum bias voltage.

7. The power amplifier circuit of claim 1, wherein an operational amplifier amplifies the output from the summing device before applying bias voltage to the power amplifier.

8. The power amplifier circuit of claim 1, further including an up-converter, wherein:
   the envelope detector is connected to an input port of the up-converter; and
   an input port of the power amplifier is connected to an output port of the up-converter.

9. The power amplifier circuit of claim 1, wherein the plurality of sets of distinct threshold voltages include a set of distinct threshold voltages corresponding to one or more of the following modulation types: QAM1024, QPSK, QAM4096.

10. A method for biasing a power amplifier using a transmission signal having a time-varying envelope comprising:
   at a power amplifier circuit that includes one or more processors and memory storing a plurality of sets of distinct threshold voltages, each set of the plurality of sets of distinct threshold voltages corresponding to a modulation type:

producing a time-varying signal indicative of an amplitude of the envelope of the transmission signal;

comparing the time-varying signal to a plurality of distinct threshold voltages;

for each of the plurality of distinct threshold voltages exceeded by the time-varying signal, providing a respective bias voltage to a respective input of a summing device;

producing, using the summing device, an output bias voltage that is at least a sum of the respective bias voltages provided to the respective inputs of the summing device;

biasing the power amplifier with the output bias voltage;

amplifying the transmission signal using the power amplifier biased at the output bias voltage;

detecting a change in modulation type of the transmission signal; and reprograming the plurality of distinct threshold voltages to a different set of distinct threshold voltages, of the plurality of sets of distinct threshold voltages, in response to the change in the modulation of the transmission signal.

11. The method of claim 10, wherein amplifying the signal carrying information occurs prior to transmission of the signal by an antenna.

12. The method of claim 10, wherein the memory also stores values for the respective bias voltages.

13. The method of claim 10, wherein the method is performed within an integrated circuit.

14. The method of claim 10, wherein the summing device is also coupled to a minimum bias voltage.

15. The method of claim 10, further comprising, amplifying the output from the summing device before applying bias voltage to the power amplifier.

16. The method of claim 10, wherein the envelope detector is connected to an input port of an up-converter.

17. The method of claim 10, wherein the plurality of sets of distinct threshold voltages include a set of distinct threshold voltages corresponding to one or more of the following modulation types: QAM1024, QPSK, QAM4096.

* * * * *